(12) United States Patent
Lin et al.

(10) Patent No.: US 9,160,253 B2
(45) Date of Patent: Oct. 13, 2015

(54) SINE PULSE WIDTH MODULATION CONTROLLER

(71) Applicant: INNO-TECH CO., LTD., Taipei (TW)

(72) Inventors: Ching-Yuan Lin, Taipei (TW); Wen-Yueh Hsieh, Taipei (TW)

(73) Assignee: INNO-TECH CO., LTD., Taipei (TW)

( * ) Notice: Subject to any disclaimer, the term of this patent is extended or adjusted under 35 U.S.C. 154(b) by 228 days.

(21) Appl. No.: 14/076,108

(22) Filed: Nov. 8, 2013

(65) Prior Publication Data

US 2014/0133205 A1    May 15, 2014

(30) Foreign Application Priority Data

Nov. 12, 2012  (TW) ............................. 101142046 A

(51) Int. Cl.
| | |
|---|---|
| *H03K 3/017* | (2006.01) |
| *H02M 7/5387* | (2007.01) |
| *H03K 5/156* | (2006.01) |
| *H03B 28/00* | (2006.01) |
| *H03K 5/04* | (2006.01) |
| *H03K 7/08* | (2006.01) |

(52) U.S. Cl.
CPC ........... *H02M 7/53871* (2013.01); *H03B 28/00* (2013.01); *H03K 3/017* (2013.01); *H03K 5/04* (2013.01); *H03K 5/1565* (2013.01); *H03K 7/08* (2013.01)

(58) Field of Classification Search
None
See application file for complete search history.

(56) References Cited

U.S. PATENT DOCUMENTS

| | | | |
|---|---|---|---|
| 8,847,639 B1* | 9/2014 | Srivastava et al. | 327/129 |
| 2010/0085097 A1* | 4/2010 | Bryant | 327/175 |
| 2010/0182053 A1* | 7/2010 | Tsai | 327/106 |
| 2012/0058383 A1* | 3/2012 | Hashizaki | 429/158 |
| 2014/0042070 A1* | 2/2014 | Lu | 210/232 |
| 2015/0168990 A1* | 6/2015 | Park et al. | G06F 1/022 |

\* cited by examiner

*Primary Examiner* — Tuan T Lam
(74) *Attorney, Agent, or Firm* — Lin & Associates IP, Inc.

(57) ABSTRACT

A sine pulse width modulation controller includes an edge detection unit for receiving a feedback input signal from the external electrical device to generate an edge signal, a register unit for storing and outputting a parameter signal, an angle increasing unit for receiving the edge signal and the parameter signal, determining cycles of pulse width modulation and generating an angle signal, a sine calculation unit for receiving the angle signal and performing a recursive algorithm based on the angle signal to implement the recursive algorithm so as to generate a sine calculation value, a multiplication unit for receiving the sine calculation value which is then further multiplied by the amplitude signal from the register unit to generate a pulse width signal, and a sine output unit receiving the pulse width signal to generate driving signals for driving the external electrical device to generate a sine terminal voltage.

4 Claims, 5 Drawing Sheets

SINE PULSE WIDTH MODULATION CONTROLLER

CROSS-REFERENCE TO RELATED APPLICATION

This application claims the priority of Taiwanese patent application No. 101142046, filed on Nov. 12, 2012, which is incorporated herewith by reference.

BACKGROUND OF THE INVENTION

1. Field of the Invention

The present invention generally relates to a sine pulse width modulation controller, and more specifically to a sine pulse width modulation controller for generating pulse width modulation driving signals for sine.

2. The Prior Arts

For various electrical and electronic application fields, especially in the power conversion, it requires to provide a sine with high precision. In the prior arts, a large amount of sine values is previously stored in the memory medium to construct a lookup table, and the system can easily read or fetch the sine value corresponding to an angle from the lookup table.

However, one of the shortcomings in the prior arts is that a large volume memory is needed and the precision of the sine generated is considerably limited. Therefore, it is greatly desired to provide a sine pulse width modulation controller which implements a suitable algorithm to save memory size and simplify the whole system architecture, thereby overcoming the above problems in the prior arts.

SUMMARY OF THE INVENTION

The primary objective of the present invention is to provide a sine pulse width modulation controller comprising an edge detection unit, a register unit, an angle increasing unit, a sine calculation unit, a multiplication unit and a sine output unit. The sine pulse width modulation controller of the present invention is used to drive an external electrical device which comprises at least one action element.

Specifically, the edge detection unit receives a feedback input signal from the external electrical device to generate the edge signal. The register unit stores at least one parameter and outputs at least one parameter signal, the amplitude signal and the operational mode. The parameter in the register is preset by a system or set by a user. The angle increasing unit receives the edge signal and the parameter signal to determine the cycles of pulse width modulation (PWM) and generate the angle signal.

The sine calculation unit receives the angle signal and performs the recursive algorithm of Coordinate Rotation Digital Computer (CORDIC) based on the angle signal so as to generate the sine calculation value, which is received by the multiplication unit and multiplied by the amplitude signal from the register unit to generate the pulse width signal. The sine output unit receives the pulse width signal and generates the sine driving signals in a manner of pulse width modulation.

Therefore, the driving signals from the sine output unit are used to drive the external electrical device to generate the sine terminal voltage at the action element.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1:
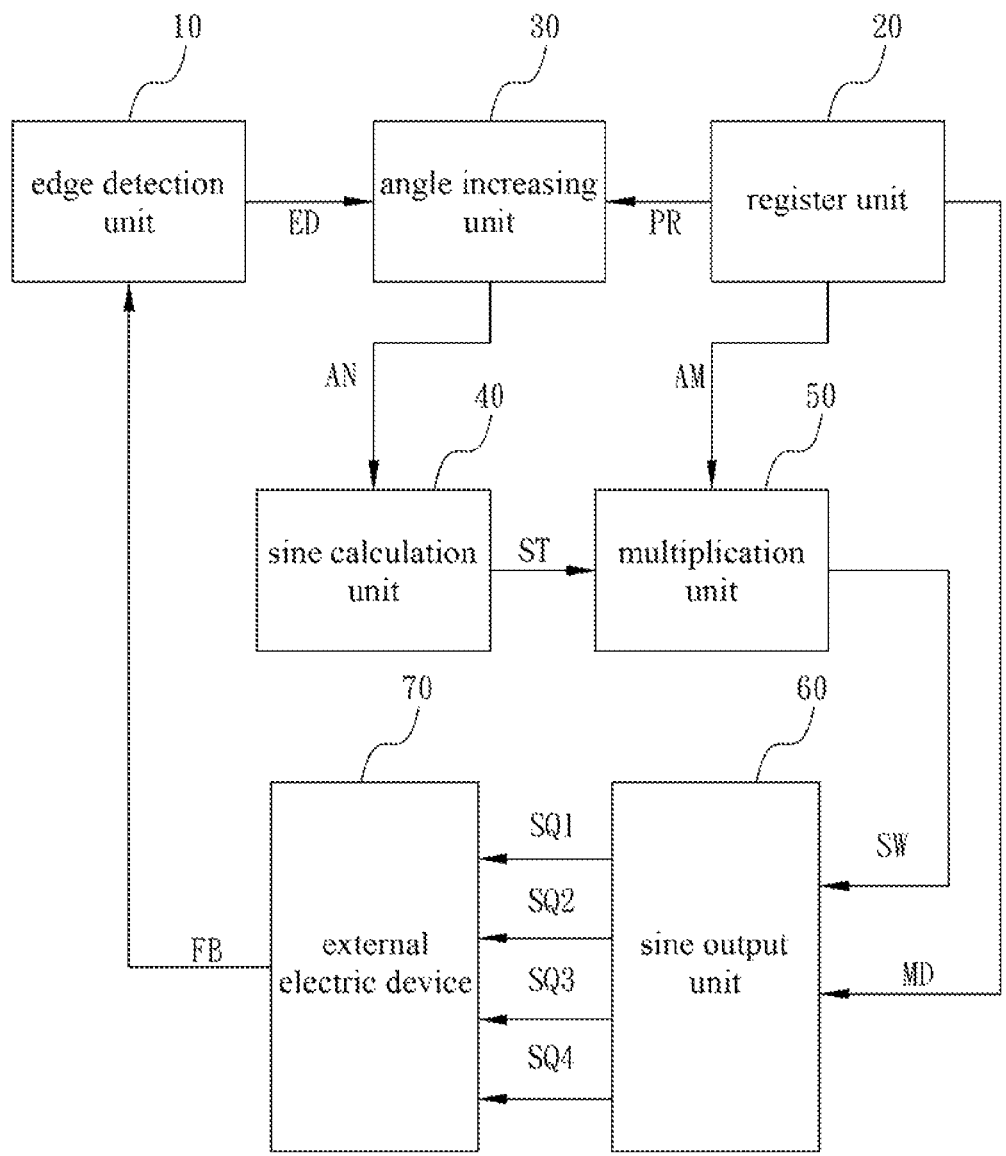
FIG. 1 illustrates a sine pulse width modulation controller according to the present invention.

FIG. 1 illustrates a sine pulse width modulation controller according to one embodiment of the present invention. As shown in FIG. 1, the sine pulse width modulation (sine PWM) controller of the present invention generally comprises an edge detection unit 10, a register unit 20, an angle increasing unit 30, a sine calculation unit 40, a multiplication unit 50 and a sine output unit 60. The sine pulse width modulation controller implements the recursive algorithm, Coordinate Rotation Digital Computer (CORDIC), and drives an external electrical device 70 to generate a sine wave. Further, the sine pulse width modulation controller of the present invention is primarily used to form a feedback loop, providing a stable feedback control mechanism.

Figure 2:
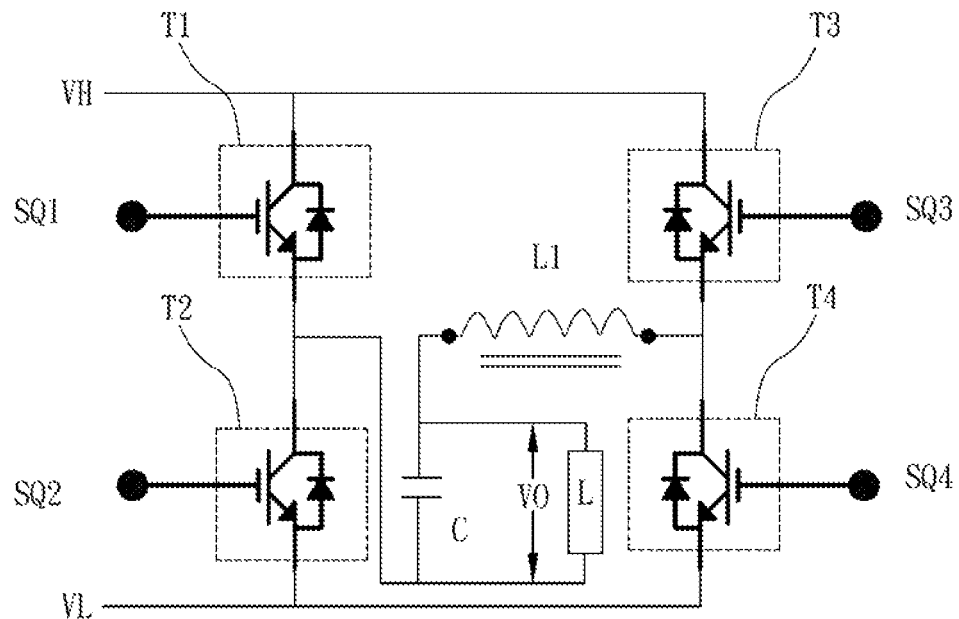
FIG. 2 is a view showing a full bridge electrical device driven by the sine pulse width modulation controller according to the present invention.
Figure 3:
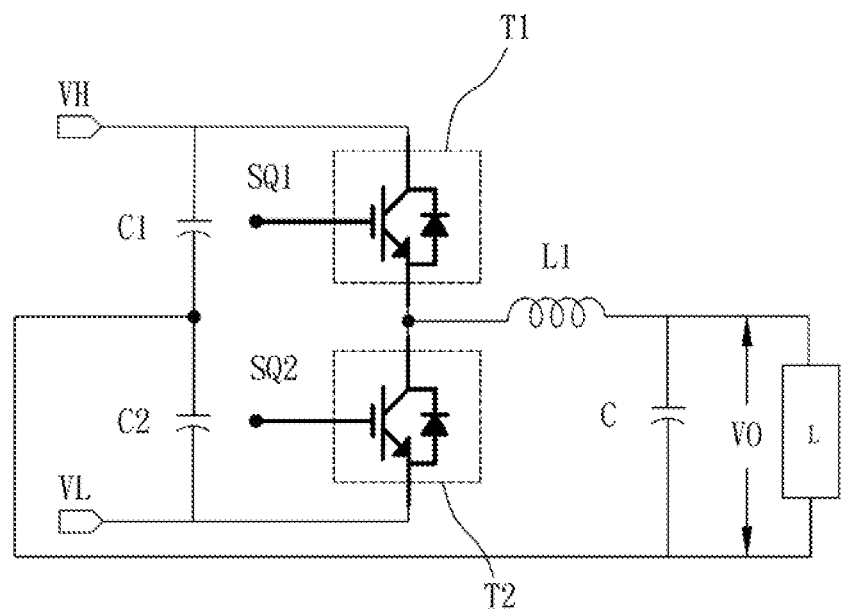
FIG. 3 is a view showing a half bridge electrical device driven by the sine pulse width modulation controller according to the present invention.

The external electrical device 70 may comprise a full bridge electrical device or a half bridge electrical device as shown in FIGS. 2 and 3, respectively. However, it should be noted that the devices illustrated in FIGS. 2 and 3 are only illustrative examples to clearly describe the characteristics of the present invention, and not intended to limit the scope of the present invention.

First, the full bridge electrical device in FIG. 2 will be described in detail. The full bridge electrical device primarily comprises a first driving transistor T1, a second driving transistor T2, a third driving transistor T3, a fourth driving transistor T4, an action element L, a filtering inductor L1 and a filtering capacitor C. Specifically, the first, second, third and fourth driving transistors T1, T2, T3 and T4 are driven by a first, second, third and fourth sine driving signals SQ1, SQ2, SQ3 and SQ4, respectively. The first driving transistor T1 and the second driving transistor T2 are connected in series and further connected across a high voltage power line VH and a low voltage power line VL. Similarly, the third driving transistor T3 and the fourth driving transistor and T4 are connected in series and further connected across the high voltage power line VH and the low voltage power line VL. Additionally, the filtering inductor L1 and the filtering capacitor C are connected in series to a connection point of the first driving transistor T1 and the second driving transistor T2 and a connection point of the third driving transistor T3 and the fourth driving transistor T4. The action element L serves as a load and shunts to the filtering capacitor C.

FIG. 3 illustrates the half bridge electrical device driven by the sine pulse width modulation controller according to the present invention. Similar to the embodiment in FIG. 2, the half bridge electrical device comprises a first driving transistor T1, a second driving transistor T2, a first capacitor C1, a second capacitor C2, an action element L, a filtering inductor L1 and a filtering capacitor C. The first driving transistor T1 and the second driving transistor T2 are driven by the first sine driving signal SQ1 and the second sine driving signal SQ2, respectively. The first driving transistor T1 and the second driving transistor T2 are connected in series and further connected across the high voltage power line VH and the low voltage power line VL. The first capacitor C1 and the second capacitor C2 are connected in series and further connected across the high voltage power line VH and the low voltage power line VL. The filtering inductor L1 and the filtering capacitor C are connected in series to a connection point of the first driving transistor T1 and the second driving transistor T2 and an end of the action element L. The other end of the action element L is connected to a connection point of the first capacitor C1 and the second capacitor C2.

The terminal voltage of the above action element L is attenuated through a voltage attenuator (not shown) to form the feedback input signal FB as shown in FIG. 1. Alternatively, the feedback input signal FB is formed by passing the current flowing through the action element L to a current attenuator (not shown).

Referring again to FIG. 1, the edge detection unit 10 of the sine pulse width modulation controller according to the present invention receives the feedback input signal FB from the external electrical device 70. At the same time, the edge detection process is performed to determine the current waveform corresponding to the feedback input signal FB is a positive half cycle or a negative half cycle such that the edge detection signal ED is generated. The register unit 20 stores at least one parameter, and outputs at least one parameter signal PR, the amplitude signal AM and the operation mode MD. The above parameters are previously set by the system or set by the user. Furthermore, the parameters include the incremental angle (like 1° or 5°), the amplitude of sine, the dead time, the trigger control bit of the PWM, and so on.

The angle increasing unit 30 receives the edge detection signal ED from the edge detection unit 10 and the parameter signal PR from the register unit 20 so as to determine the PWM cycles in the half cycle and generate the angle signal AN. For example, if the parameter signal PR is 1, there are 180 PWM cycles per half cycle, or if the parameter signal PR is 0.5, there are 360 PWM cycles per half cycle.

The sine calculation unit 40 receives the angle signal AN from the angle increasing unit 30, and performs the right shift operation based on the angle increasing unit 30 so as to implement the recursive algorithm of Coordinate Rotation Digital Computer (CORDIC) and generates the sine calculation value ST. The following description is intended to illustrate the detailed operation of CORDIC recursive algorithm.

Figure 4:
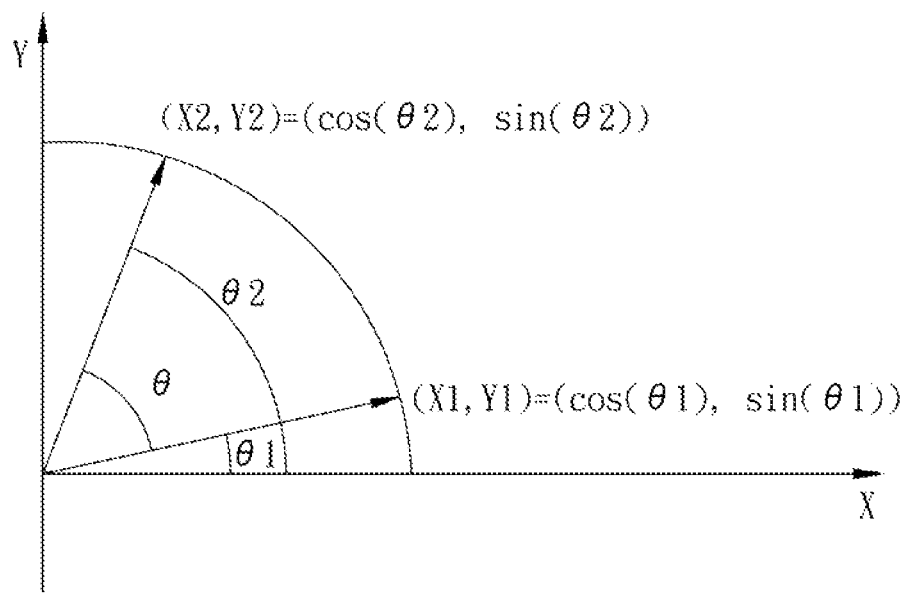
FIG. 4 is a view illustrating a recursive algorithm of Coordinate Rotation Digital Computer (CORDIC) used in the sine pulse width modulation controller according to the present invention.

The current sine amplitude, $\sin(\theta)$, is determined by the previous amplitude, where $\theta$ is the corresponding angle. The whole sine is evenly divided from the angle 0° and the amplitude at the next angle is thus found. Specifically, referring to FIG. 4, the coordinates of two points (X1, Y1) and (X2, Y2) in the planar rectangular coordinates are generally expressed as:

$$(X1, Y1) = (\cos(\theta1), \sin(\theta1))$$

$$(X2, Y2) = (\cos(\theta2), \sin(\theta2))$$

where θ1 and θ2 are the angles of the two coordinates (X1, Y1) and (X2, Y2), respectively, and the angle θ is the difference between θ2 and θ1 (θ=θ2−θ1). Therefore, the coordinates (X2, Y2) can be expressed in terms of the coordinates (X1, Y1) by:

$$X2 = X1*\cos(\theta) - Y1*\sin(\theta)$$

$$Y2 = X1*\sin(\theta) + Y1*\cos(\theta)$$

or alternatively further expressed as:

$$X2 = \cos(\theta)*[X1 - Y1*\tan(\theta)]$$

$$Y2 = \cos(\theta)*[X1*\tan(\theta) + Y1].$$

A general expression of the above coordinates is shown as follows:

$$Xn = \cos(\theta n)*[Xn-1 - Yn-1*\tan(\theta n)]$$

$$Yn = \cos(\theta n)*[Xn-1*\tan(\theta n) + Yn-1]$$

where n is a nonnegative integer, like n=0, 1, 2, 3, and so on, and θn is the corresponding angle between the nth coordinate (Xn, Yn) and the previous (n−1)th coordinate (Xn−1, Yn−1). The initial value of θn (n=0) is 0°, and the angle θn for n=1, 2 and 3 is 45°, 26.565° and 14.0362°, respectively. In other words, $\theta n = \tan^{-1}(\frac{1}{2}^{n-1})$.

Therefore, the sine calculation unit 40 implements the CORDIC recursive algorithm by right shifting the previous value (such as tan(θn−1)) by one bit to obtain the current value, tan(θn), and the resultant sine calculation value ST refers to tan(θn), that is, $\frac{1}{2}^{n-1}$.

Figure 5:
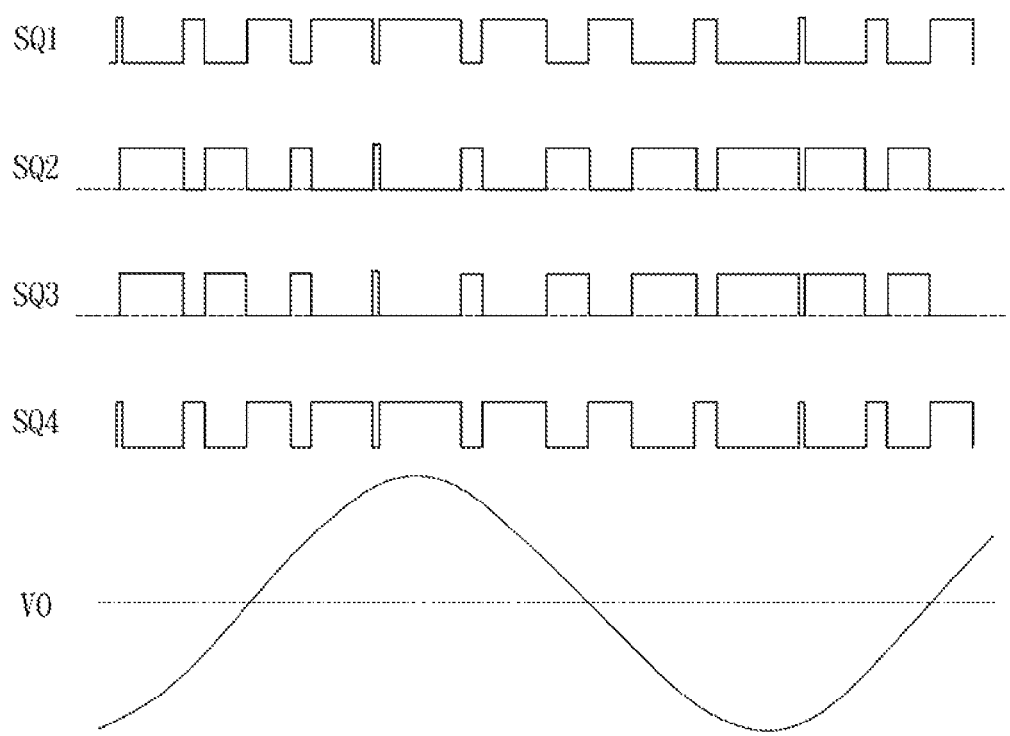
FIG. 5 is a view showing an output waveform of the sine pulse width modulation controller according to the present invention.

The multiplication unit 50 receives the sine calculation value ST, which is further multiplied by the amplitude signal AM from the register unit 20 to generate the pulse width modulation signal SW. The sine output unit 60 receives the pulse width modulation signal SW and generates the first, second, third and fourth sine driving signal SQ1, SQ2, SQ3 and SQ4 for driving the external electrical device 70 to generate the sine terminal voltage Vo, as shown in FIG. 5. It should be noted that the half bridge electrical device in FIG. 3 can be driven by only the first and second sine driving signal SQ1 and SQ2.

From the above description, one feature of the present invention is that the sine calculation unit can calculate the tangential value (tan) at the next angle by right shifting one bit, which is used in the subsequent process to generate the sine driving signal. Thus, it is not required to use a large memory to store precise data of trigonometric function for the lookup table so as to simplify the whole architecture, thereby increasing the operation speed and efficiency.

Although the present invention has been described with reference to the preferred embodiments, it will be understood that the invention is not limited to the details described thereof Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A sine pulse width modulation controller for driving an external electrical device including at least one action element, comprising:

an edge detection unit for receiving a feedback input signal from the external electrical device to perform edge detection and generate an edge signal;

a register unit for storing at least one parameter and outputting at least one parameter signal, an amplitude signal and an operational mode, wherein the at least one parameter is preset by a system or set by a user;
an angle increasing unit for receiving the edge signal and the parameter signal to determine cycles of pulse width modulation (PWM) and generate an angle signal;
a sine calculation unit for receiving the angle signal and performing a right shift operation based on the angle signal to implement a recursive algorithm of Coordinate Rotation Digital Computer (CORDIC) so as to generate a sine calculation value;
a multiplication unit for receiving the sine calculation value multiplied by the amplitude signal from the register unit to generate a pulse width signal; and
a sine output unit for receiving the pulse width signal and generating a first, second, third, and fourth sine driving signals in a manner of pulse width modulation to drive the external electrical device and cause the action element to generate a sine terminal voltage.

2. The sine pulse width modulation controller as claimed in claim 1, wherein the external electrical device further comprises a first driving transistor, a second driving transistor, a third driving transistor, a fourth driving transistor, a filtering inductor and a filtering capacitor, the first, second, third and fourth driving transistors are driven by a first, second, third and fourth sine driving signals, respectively, the first and second driving transistors are connected in series and further connected across a high voltage power line and a low voltage power line, the third and fourth driving transistors are connected in series and further connected across the high voltage power line and the low voltage power line, the filtering inductor and the filtering capacitor are connected in series to a connection point of the first and second driving transistors and a connection point of the third and fourth driving transistors, and the action element is served as a load and shunted to the filtering capacitor.

3. The sine pulse width modulation controller as claimed in claim 1, wherein the external electrical device further comprises a first driving transistor, a second driving transistor, a first capacitor, a second capacitor, a filtering inductor and a filtering capacitor, the first and second driving transistors are driven by a first and second sine driving signals, respectively, the first and second driving transistors are connected in series and further connected across a high voltage power line and a low voltage power line, the first and second capacitors are connected in series and further connected across the high voltage power line and the low voltage power line, the filtering inductor and the filtering capacitor are connected to a connection point of the first and second driving transistors and an end of the action element, the other end of the action element is connected to a connection point of the first and second capacitors, and the action element is shunted to the filtering capacitor.

4. The sine pulse width modulation controller as claimed in claim 1, wherein the feedback input signal is generated by processing the terminal voltage of the action element via a voltage attenuator, or the feedback input signal is formed by passing a current flowing through the action element to a current attenuator.

* * * * *